(12) United States Patent
Yuan (10) Patent No.: US 9,921,616 B1
(45) Date of Patent: Mar. 20, 2018

(54) RISER CARD AND MOTHERBOARD MODULE THEREOF

(71) Applicant: Wistron Corporation, New Taipei (TW)

(72) Inventor: Chao-Hsin Yuan, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/618,134

(22) Filed: Jun. 9, 2017

(30) Foreign Application Priority Data

Mar. 9, 2017 (TW) .............................. 106107806 A (51) Int. Cl.
*G06F 1/18* (2006.01)
*H05K 7/14* (2006.01)

(52) U.S. Cl.
CPC .............. *G06F 1/186* (2013.01); *G06F 1/181* (2013.01); *G06F 1/185* (2013.01); *H05K 7/1487* (2013.01)

(58) Field of Classification Search
CPC ................................. G06F 1/185; G06F 1/186
USPC .................................................... 361/679.32
See application file for complete search history.

(56) References Cited

U.S. PATENT DOCUMENTS

| | | | |
|---|---|---|---|
| 2002/0093797 A1* | 7/2002 | Willis ..................... | G06F 1/181 361/752 |
| 2004/0252471 A1* | 12/2004 | Barsun .................... | G06F 1/184 361/801 |
| 2005/0152122 A1* | 7/2005 | Fan .......................... | G06F 1/184 361/752 |

* cited by examiner

*Primary Examiner* — Adrian S Wilson
(74) *Attorney, Agent, or Firm* — Winston Hsu (57) ABSTRACT

A riser card is used for inserting into a motherboard module including a casing and a motherboard disposed in the casing, and includes a handle bar, a main body and first and second linkage mechanisms pivoted to the main body. A side wall of the casing corresponding to a slot of the motherboard has first and second support pillars. The handle bar moves between non-pressed and pressed positions with swinging of the first and second linkage mechanisms. When the first and second linkage mechanisms are supported by the first and second support pillars and the handle bar is pressed to the pressed position, the handle bar is collinear with the first and second linkage mechanisms, and the first and second linkage mechanisms abut against the first and second support pillars to move and rotate for generating lever torques to insert a card pin of the riser card into the slot.

10 Claims, 6 Drawing Sheets

RISER CARD AND MOTHERBOARD MODULE THEREOF

BACKGROUND OF THE INVENTION

1. Field of the Invention

The present invention relates to a riser card and a motherboard module thereof, and more specifically, to a riser card for being inserted into or detached from a motherboard via linkage mechanisms and a motherboard module thereof.

2. Description of the Prior Art

In general, a riser card is usually used for simultaneously installing a plurality of interface cards (e.g. Peripheral Component Interconnected-Express (PCI-E) card) on one single slot of a motherboard in a server for efficient use of internal space of the server.

A conventional installation method is to insert a card pin of the riser card having the plurality of interface cards disposed thereon into a slot of the motherboard tightly. However, since the riser card usually has a main body with a long length for providing enough space to installation of the plurality of interface cards and needs to have a high pin count for establishing electrical connection between the plurality of interface cards and the motherboard, it is not easy to insert the riser card into the motherboard or detach the riser card from the motherboard. Furthermore, the card pin of the riser card may damage easily since the aforesaid long body design usually results in oblique angled installation and excessively large plugging force during the installation process of the riser card, so as to cause a user much inconvenience in assembly and disassembly of the riser card on the motherboard.

SUMMARY OF THE INVENTION

The present invention provides a riser card for inserting into a motherboard module. The motherboard module includes a motherboard and a casing. The motherboard is disposed in the casing and has at least one slot. A side wall of the casing corresponding to the at least one slot has a first support pillar and a second support pillar. The riser card includes a main body, a first linkage mechanism, a second linkage mechanism, and a handle bar. The main body has a card pin corresponding to the at least one slot. The first linkage mechanism includes a first linkage, a second linkage, and a first bridge sheet. The first linkage is pivoted to the main body. The second linkage is pivoted to the main body and has a first recessed end portion. The first bridge sheet has at least two first limiting pillars. The first bridge sheet is pivoted to the first linkage and the second linkage respectively, so as to make the first linkage and the second linkage swing in parallel to be oblique or parallel to the main body. The second linkage mechanism is disposed at a side of the first linkage mechanism. The second linkage mechanism includes a third linkage, a fourth linkage, and a second bridge sheet. The third linkage is pivoted to the main body. The fourth linkage is pivoted to the main body and has a second recessed end portion. The second bridge sheet has at least two second limiting pillars. The second bridge sheet is pivoted to the third linkage and the fourth linkage respectively, so as to make the third linkage and the fourth linkage swing in parallel to be oblique or parallel to the main body. The handle bar has a first sliding slot and a second sliding slot. The at least two first limiting pillars are slidably inserted into the first sliding slot and the at least two second limiting pillars are slidably inserted into the second sliding slot for making the handle bar movable between a non-pressed position and a pressed position with swinging of the first linkage mechanism and the second linkage mechanism. When the first recessed end portion and the second recessed end portion are supported by the first support pillar and the second support pillar respectively and the handle bar is pressed from the non-pressed position to the pressed position, the at least two first limiting pillars slide inwardly along the first sliding slot and the at least two second limiting pillars slide inwardly along the second sliding slot to make the handle bar substantially collinear with the first linkage mechanism and the second linkage mechanism, and the first recessed end portion and the second recessed end portion abut against the first support pillar and the second support pillar respectively to move and rotate for generating lever torques to insert the card pin into the at least one slot.

The present invention further provides a motherboard module for being removably disposed in a server. The motherboard module includes a motherboard device and a riser card. The motherboard device includes a motherboard and a casing. The motherboard is disposed in the casing and has at least one slot. A side wall of the casing corresponding to the at least one slot has a first support pillar and a second support pillar. The riser card includes a main body, a first linkage mechanism, a second linkage mechanism, and a handle bar. The main body has a card pin corresponding to the at least one slot. The first linkage mechanism includes a first linkage, a second linkage, and a first bridge sheet. The first linkage is pivoted to the main body. The second linkage is pivoted to the main body and has a first recessed end portion. The first bridge sheet has at least two first limiting pillars. The first bridge sheet is pivoted to the first linkage and the second linkage respectively, so as to make the first linkage and the second linkage swing in parallel to be oblique or parallel to the main body. The second linkage mechanism is disposed at a side of the first linkage mechanism. The second linkage mechanism includes a third linkage, a fourth linkage, and a second bridge sheet. The third linkage is pivoted to the main body. The fourth linkage is pivoted to the main body and has a second recessed end portion. The second bridge sheet has at least two second limiting pillars. The second bridge sheet is pivoted to the third linkage and the fourth linkage respectively, so as to make the third linkage and the fourth linkage swing in parallel to be oblique or parallel to the main body. The handle bar has a first sliding slot and a second sliding slot. The at least two first limiting pillars are slidably inserted into the first sliding slot and the at least two second limiting pillars are slidably inserted into the second sliding slot for making the handle bar movable between a non-pressed position and a pressed position with swinging of the first linkage mechanism and the second linkage mechanism. When the first recessed end portion and the second recessed end portion are supported by the first support pillar and the second support pillar respectively and the handle bar is pressed from the non-pressed position to the pressed position, the at least two first limiting pillars slide inwardly along the first sliding slot and the at least two second limiting pillars slide inwardly along the second sliding slot to make the handle bar substantially collinear with the first linkage mechanism and the second linkage mechanism, and the first recessed end portion and the second recessed end portion abut against the first support pillar and the second support pillar respectively to move and rotate for generating lever torques to insert the card pin into the at least one slot.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
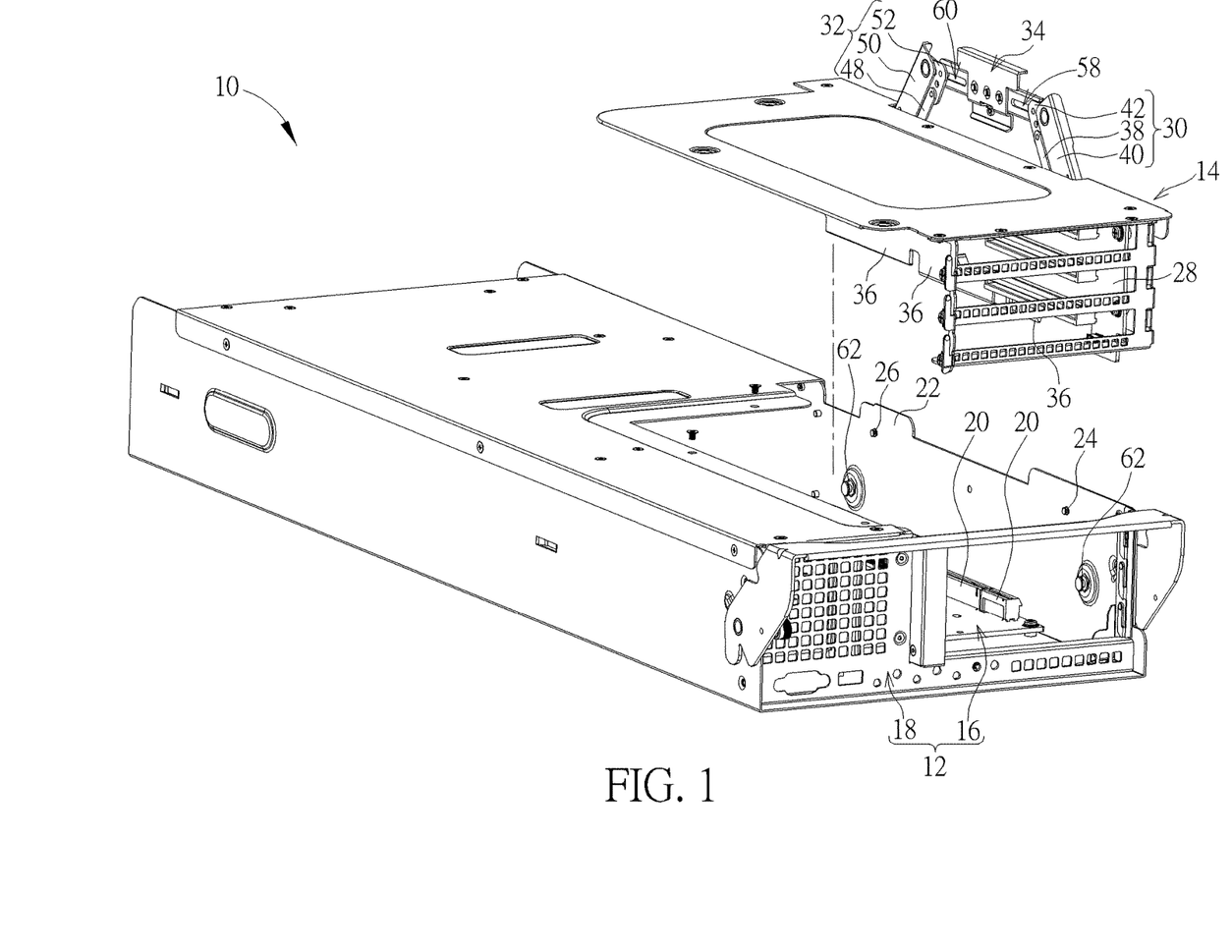
FIG. 1 is a partial exploded diagram of a motherboard module according to an embodiment of the present invention.

Please refer to FIG. 1, which is a partial exploded diagram of a motherboard module 10 according to an embodiment of the present invention. The motherboard module 10 could be removably disposed in a server for performing signal transmission and data processing of the server. As shown in FIG. 1, the motherboard module 10 includes a motherboard device 12 and a riser card 14. The motherboard device 12 includes a motherboard 16 and a casing 18. The motherboard 16 is disposed in the casing 18 and has at least one slot 20. In this embodiment, the motherboard 16 could preferably have three slots 20 (but not limited thereto), and only two slots 20 are shown in FIG. 1 due to viewing angle. The slot 20 could be a bus slot (e.g. PCI-E bus slot) for a riser card. A side wall 22 of the casing 18 corresponding to the slot 20 has a first support pillar 24 and a second support pillar 26 for supporting and positioning the riser card 14.

Figure 2:
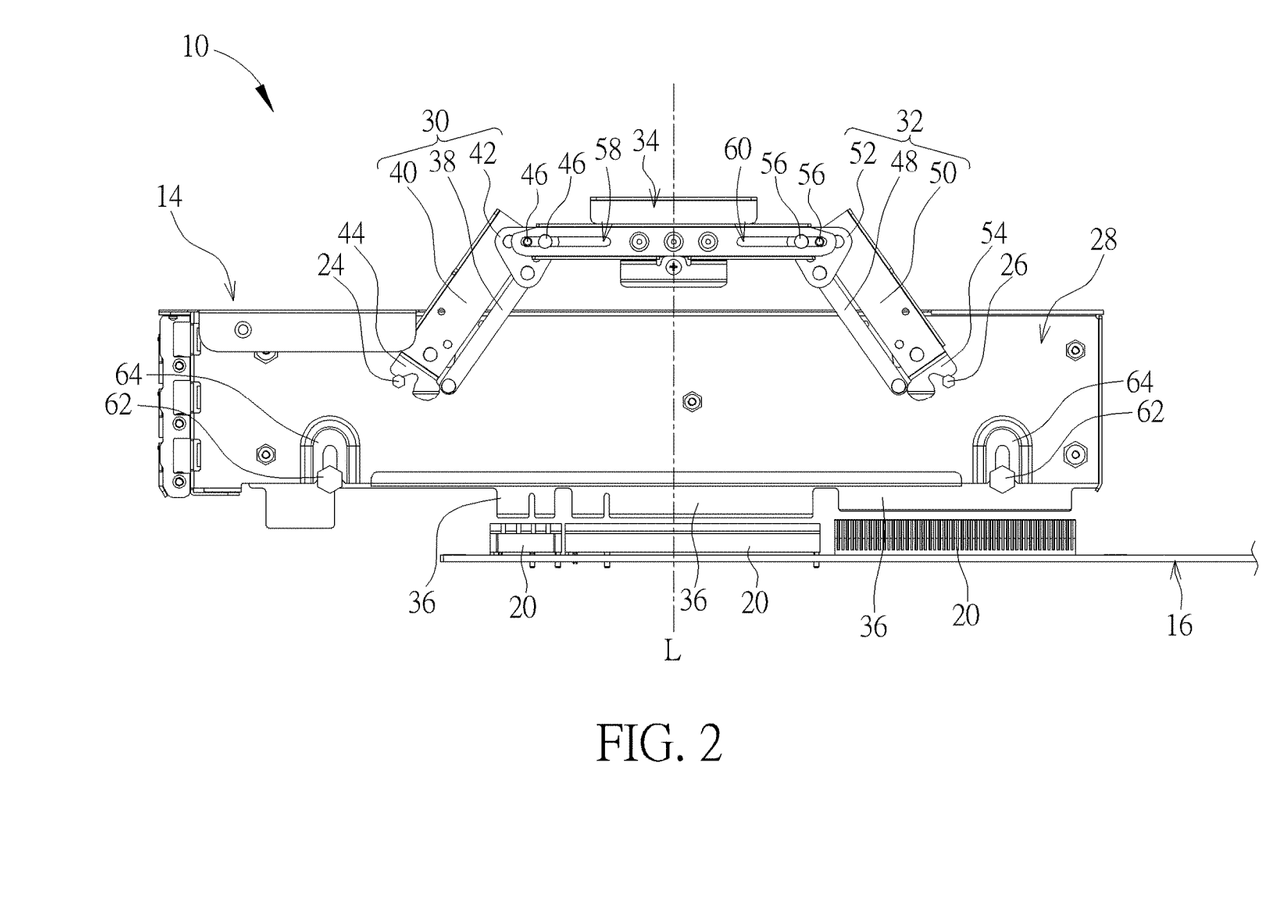
FIG. 2 is a side view of a riser card in FIG. 1 being located at a non-pressed position.

The mechanical design of the riser card 14 is described in the following. Please refer to FIG. 1 and FIG. 2. FIG. 2 is a side view of the riser card 14 in FIG. 1 being located at a non-pressed position. For clearly showing the relative position and structural relationship of the riser card 14, the motherboard 16 and the casing 18, the frame structure of the casing 18 is omitted and only the first support pillar 24 and the second support pillar 26 are depicted for the casing 18 in FIG. 2.

As shown in FIG. 1 and FIG. 2, the riser card 14 includes a main body 28, a first linkage mechanism 30, a second linkage mechanism 32, and a handle bar 34. The main body 28 could include major components of the riser card 14 (e.g. circuit board, interface card expansion slot, etc.) and have three card pins 36 respectively corresponding to the three slots 20 with different pin specifications (but not limited thereto). The first linkage mechanism 30 includes a first linkage 38, a second linkage 40, and a first bridge sheet 42. The first linkage 38 is pivoted to the main body 28, and the second linkage 40 is pivoted to the main body 28 and has a first recessed end portion 44. The first bridge sheet 42 could preferably be in an inverted-triangle shape (but not limited thereto) and have at least two first limiting pillars 46 (two shown in FIG. 2, but not limited thereto). The first bridge sheet 42 is pivoted to the first linkage 38 and the second linkage 40 respectively to form a parallelogram linkage mechanism on the main body 28 cooperatively with the first linkage 38 and the second linkage 40, so that the first linkage 38 and the second linkage 40 could swing in parallel to be oblique or parallel to the main body 28. The second linkage mechanism 32 is disposed at a side of the first linkage mechanism 30 and includes a third linkage 48, a fourth linkage 50, and a second bridge sheet 52. The third linkage 48 is pivoted to the main body 28, and the fourth linkage 50 is pivoted to the main body 28 and has a second recessed end portion 54. The second bridge sheet 52 could preferably be in an inverted-triangle shape (but not limited thereto) and have at least two second limiting pillars 56 (two shown in FIG. 2, but not limited thereto). The second bridge sheet 52 is pivoted to the third linkage 48 and the fourth linkage 50 respectively to form a parallelogram linkage mechanism on the main body 28 cooperatively with the third linkage 48 and the fourth linkage 50, so that the third linkage 48 and the fourth linkage 50 could swing in parallel to be oblique or parallel to the main body 28. The handle bar 34 has a first sliding slot 58 and a second sliding slot 60. The two first limiting pillars 46 are slidably inserted into the first sliding slot 58 and the two second limiting pillars 56 are slidably inserted into the second sliding slot 60, so that the two first limiting pillars 46 could only slide along the first sliding slot 58 in parallel and the two second limiting pillars 56 could only slide along the second sliding slot 60 in parallel. Accordingly, the handle bar 34 could move up and down relative to the main body 28 with swinging of the first linkage mechanism 30 and the second linkage mechanism 32.

To be more specific in this embodiment, as shown in FIG. 2, the handle bar 34 could preferably be disposed at a position corresponding to a longitudinal center axis L of the main body 28, and the first linkage mechanism 30 could preferably be symmetrical with respect to the second linkage mechanism 32 and have the identical linkage mechanical design with the second linkage mechanism 32, to make the handle bar 34 located at the non-pressed position as shown in FIG. 2 form an isosceles trapezoid shape cooperatively with the first linkage mechanism 30 and the second linkage mechanism 32. In such a manner, the linkage device formed by the handle bar 34, the first linkage mechanism 30 and the second linkage mechanism 32 could exert a uniform force upon the main body 28 of the riser card 14 during a user inserts the riser card 14 into the motherboard 16 or detaches the riser card 14 from the motherboard 16.

Furthermore, please refer to FIG. 1 and FIG. 2. In practical application, the side wall 22 of the casing 18 could further have at least one positioning pillar 62 (two shown in FIG. 1 and FIG. 2, but not limited thereto). The main body 28 could further have a positioning slot 64 corresponding to the positioning pillar 62. Accordingly, the positioning slot 64 could be engaged with the positioning pillar 62 to guide the card pin 36 to be inserted into the slot 20 precisely, so as to prevent oblique angled installation of the riser card 14 on the motherboard 16 during the user inserts the riser card 14 into the motherboard 16.

Figure 3:
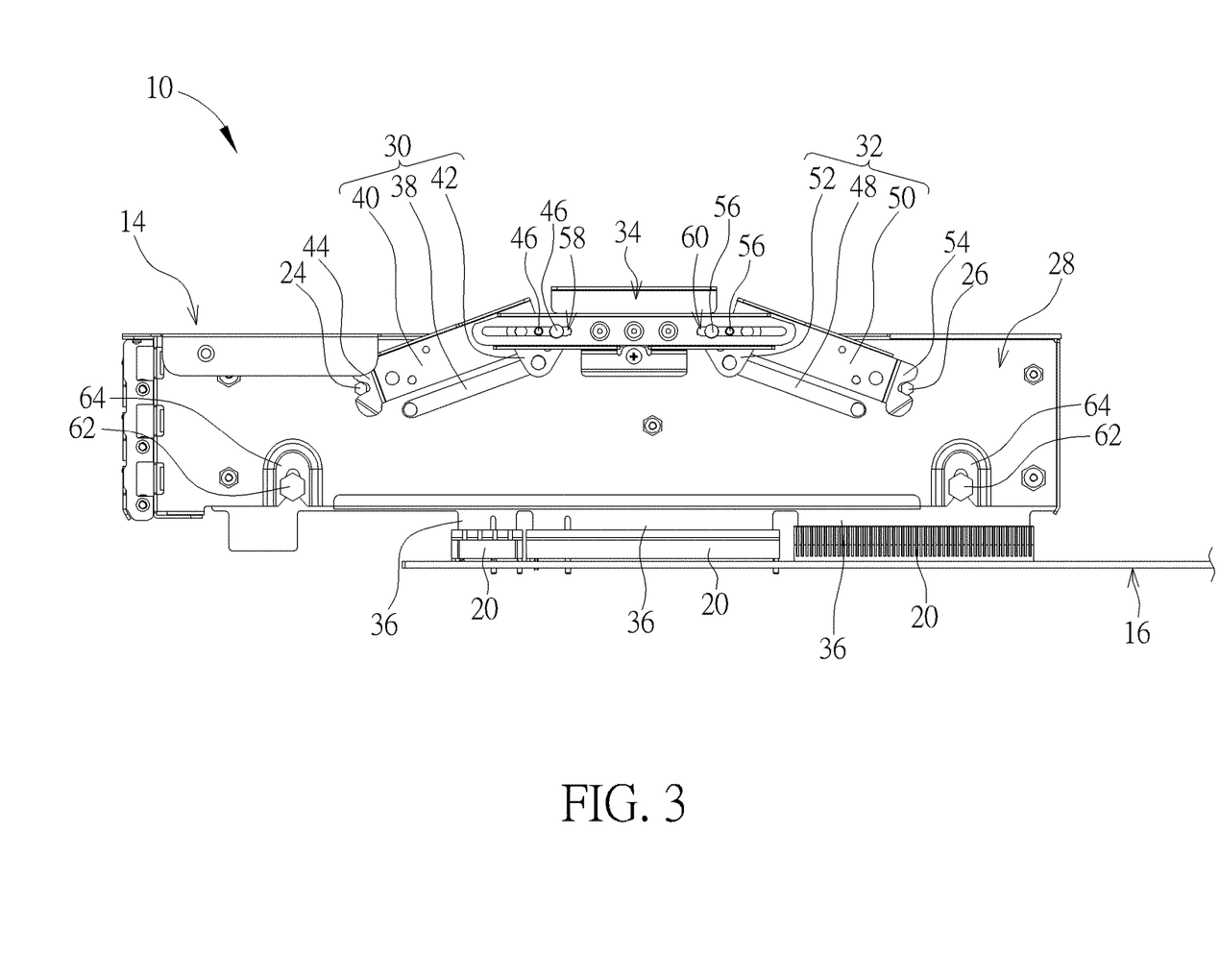
FIG. 3 is a side view of a handle bar in FIG. 2 being pressed.
Figure 4:
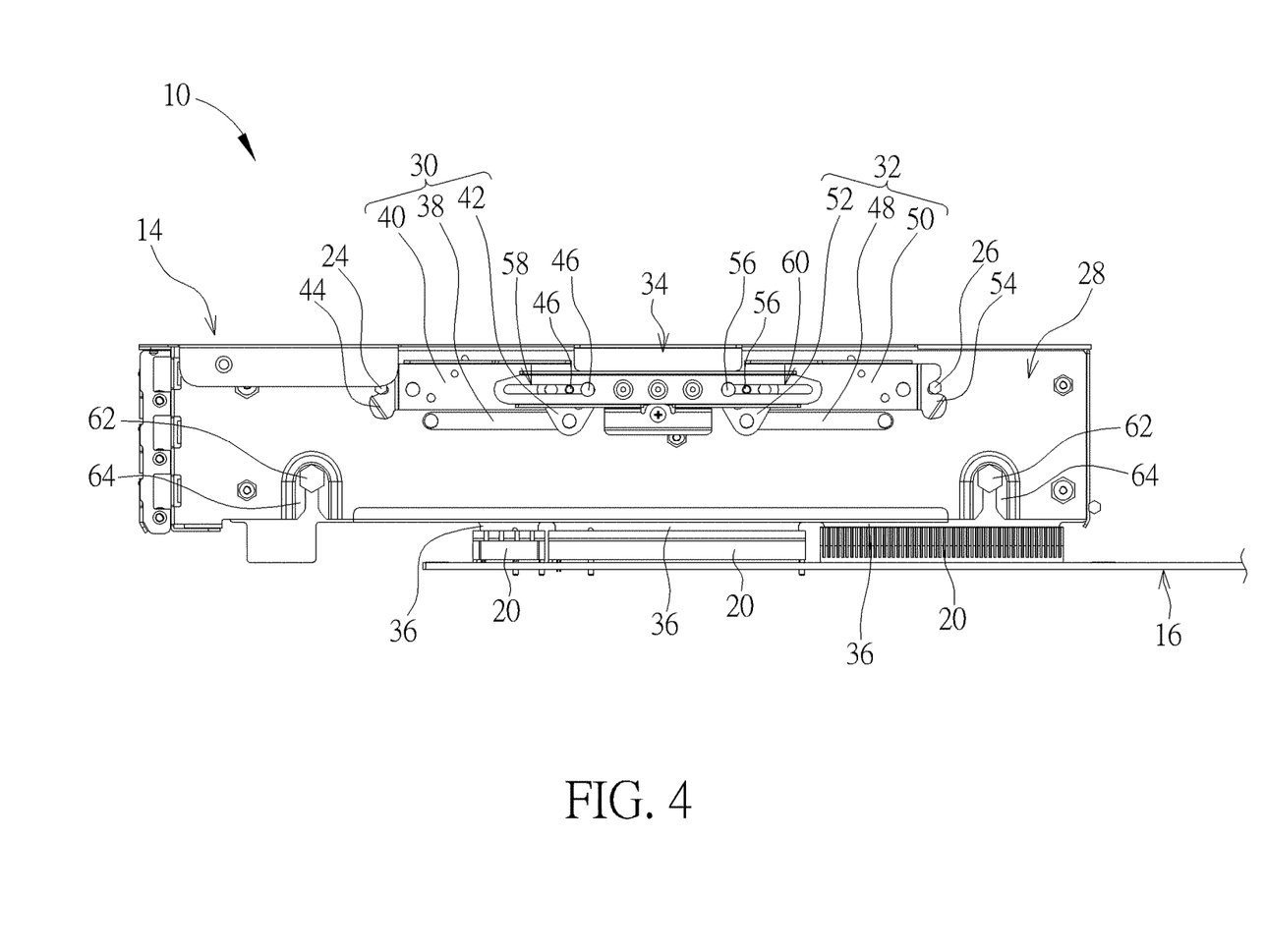
FIG. 4 is a side view of the handle bar in FIG. 3 being pressed to a pressed position.
Figure 5:
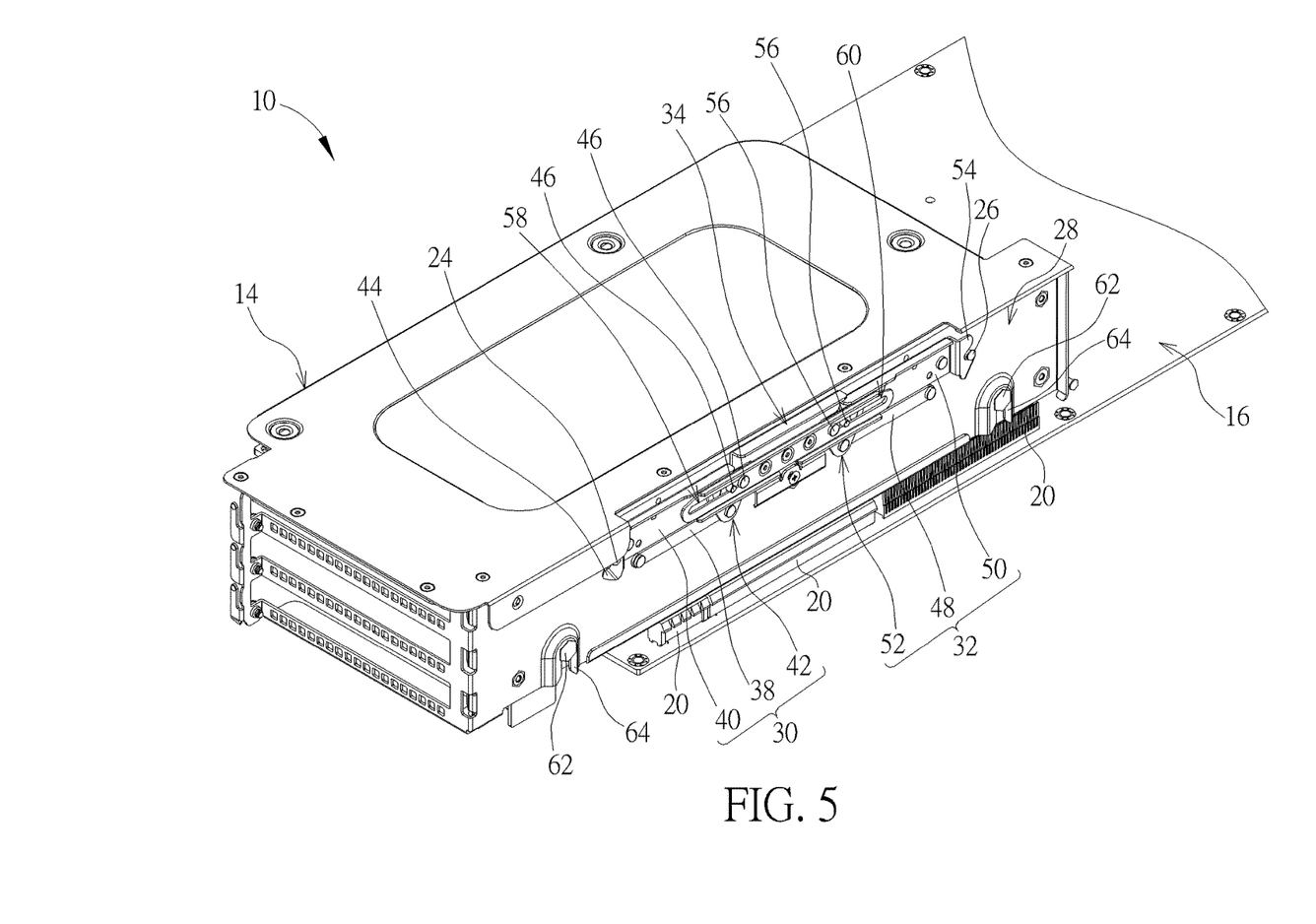
FIG. 5 is a partial schematic diagram of the riser card and a motherboard in FIG. 4 from another viewing angle.
Figure 6:
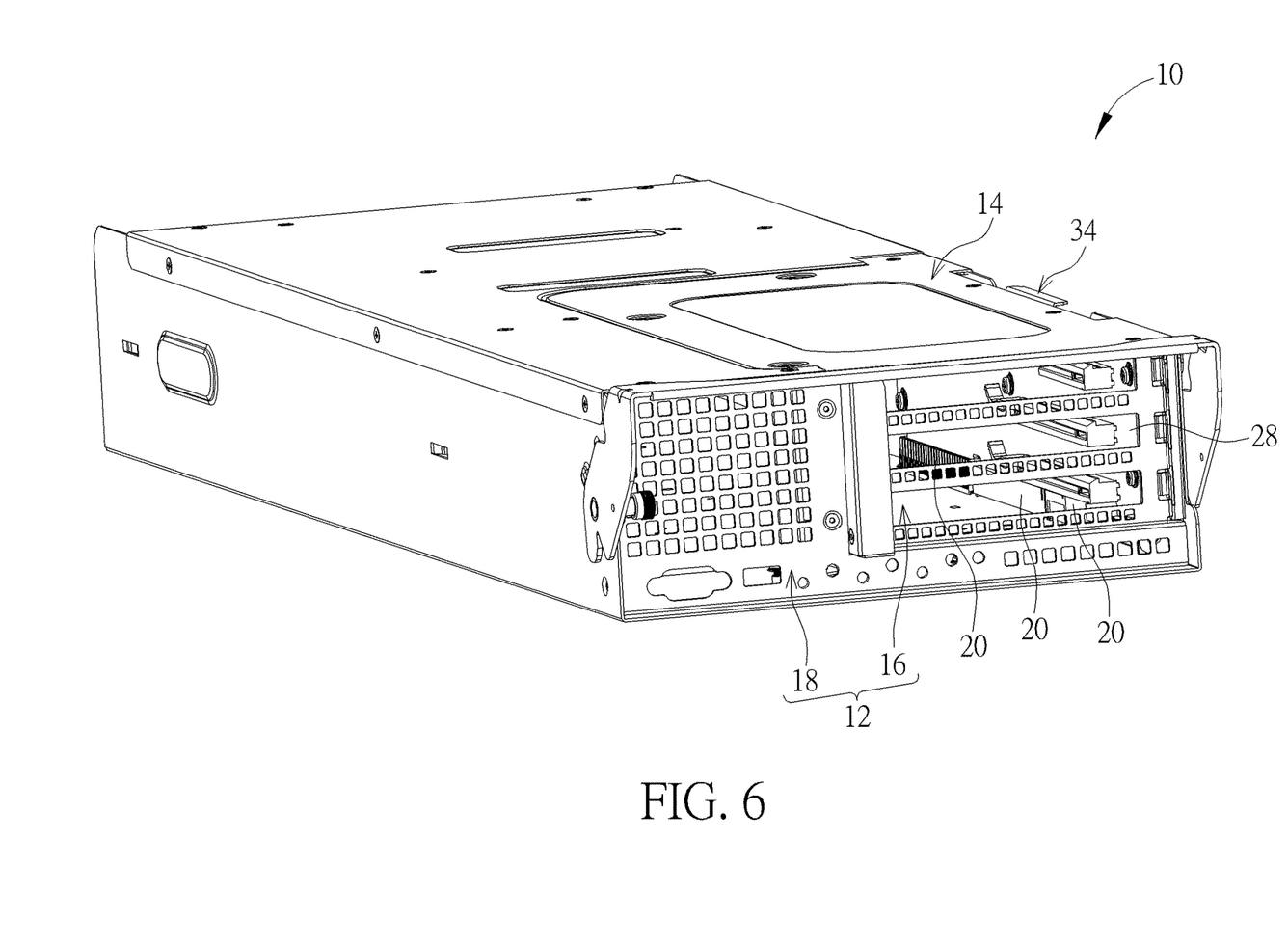
FIG. 6 is a schematic diagram of the riser card in FIG. 1 being inserted into a motherboard device.

More detailed description for the assembly and disassembly operations of the riser card 14 is provided as follows. Please refer to FIG. 2, FIG. 3, FIG. 4, FIG. 5, and FIG. 6. FIG. 3 is a side view of the handle bar 34 in FIG. 2 being pressed. FIG. 4 is a side view of the handle bar 34 in FIG. 3 being pressed to the pressed position. FIG. 5 is a partial schematic diagram of the riser card 14 and the motherboard 16 in FIG. 4 from another viewing angle. FIG. 6 is a schematic diagram of the riser card 14 in FIG. 1 being inserted into the motherboard device 12. As shown in FIG. 2, FIG. 3, FIG. 4, FIG. 5, and FIG. 6, when the user wants to insert the riser card 14 into the motherboard 16, the user just needs to align the card pin 36 of the main body 28 with the corresponding slot 20 on the motherboard 16 to make the riser card 14 located at a position as shown in FIG. 2. At this time, as shown in FIG. 2, via abutting of the first recessed end portion 44 of the second linkage 40 against the first support pillar 24 and abutting of the second recessed end portion 54 of the fourth linkage 50 against the second support pillar 26, the main body 28 could be supported steadily at the position as shown in FIG. 2. Subsequently, the user could press the handle bar 34 from the non-pressed position as shown in FIG. 2, to an intermediate position as shown in FIG. 3, and then to the pressed position as shown in FIG. 4. During the aforesaid process, via the parallelogram linkage mechanism formed by the first bridge sheet 42, the first linkage 38 and the second linkage 40, the parallelogram linkage mechanism formed by the second bridge sheet 52, the third linkage 48 and the fourth linkage 50, horizontal sliding of the first limiting pillars 46 along the first sliding slot 58, and horizontal sliding of the second limiting pillars 56 along the second sliding slot 60, the first limiting pillars 46 could slide inwardly to a position as shown in FIG. 4 along the first sliding slot 58 and the second limiting pillars 56 could slide inwardly to a position as shown in FIG. 4 along the second sliding slot 60 with downward swinging of the first linkage mechanism 30 and the second linkage mechanism 32 (at this time, the handle bar 34 is substantially collinear with the first linkage mechanism 30 and the second linkage mechanism 32 to be in a closed state). Simultaneously, the first recessed end portion 44 and the second recessed end portion 54 could abut against the first support pillar 24 and the second support pillar 26 respectively to move and rotate from a position as shown in FIG. 2 to a position as shown in FIG. 4, so as to generate corresponding leverage torques (respectively taking a position where the second linkage 40 is pivoted to the main body 28 and a position where the fourth linkage 50 is pivoted to the main body 28 as leverage fulcrums) to press the main body 28 for inserting the card pin 36 into the slot 20. To be noted, as shown in FIG. 2, FIG. 3, and FIG. 4, during the aforesaid process, the positioning slot 64 is engaged with the positioning pillar 62 to guide the card pin 36 to be inserted into the slot 20 precisely. In such a manner, as shown in FIG. 4 and FIG. 5, the riser card 14 could be installed on the motherboard 12 steadily, so that the user could conveniently perform subsequent related operation, such as inserting the motherboard module 10 as shown in FIG. 6 into a server.

Furthermore, please refer to FIG. 4. In this embodiment, a distance between the first recessed end portion 44 and a position where the second linkage 40 is pivoted to the main body 28 could be preferably less than a distance between the position where the second linkage 40 is pivoted to the main body 28 and a position where the second linkage 40 is pivoted to the first bridge sheet 42. In such a manner, as known from the lever principle (the related description is omitted herein since it is commonly seen in the prior art), the user could easily press the main body 28 to insert the card pin 36 into the slot 20 by pressing the handle bar 34. To be noted, the aforesaid design could be also applied to pivotal connection of the fourth linkage 50 to the main body 28 and the second bridge sheet 52, and the related description could be reasoned from analogy according to the aforesaid embodiment and omitted herein.

As for the operation for pulling the riser card 14 out of the motherboard 16, the related description could be reasoned from analogy according to the FIG. 2, FIG. 3, and FIG. 4. In brief, when the user wants to pull the riser card 14 out of the motherboard 16, the user just needs to pull up the handle bar 34 from the pressed position as shown in FIG. 4, to the intermediate position as shown in FIG. 3, then to the non-pressed position as shown in FIG. 2. In this embodiment, via the aforesaid linkage mechanical design that the handle bar 34 is pivoted to the first linkage mechanism 30 and the second linkage mechanism 32, the first limiting pillars 46 could slide outwardly to a position as shown in FIG. 2 along the first sliding slot 58 and the second limiting pillars 56 could slide outwardly to a position as shown in FIG. 2 along the second sliding slot 60 with upward swinging of the first linkage mechanism 30 and the second linkage mechanism 32 (at this time, the handle bar 34 could substantially form an isosceles trapezoid shape cooperatively with the first linkage mechanism 30 and the second linkage mechanism 32 to be in a state capable of being pressed). Simultaneously, the first recessed end portion 44 and the second recessed end portion 54 could abut against the first support pillar 24 and the second support pillar 26 respectively to move and rotate from the position as shown in FIG. 4 to the position as shown in FIG. 2, so as to generate corresponding leverage torques (respectively taking the position where the second linkage 40 is pivoted to the main body 28 and the position where the fourth linkage 50 is pivoted to the main body 28 as the leverage fulcrums) to move the main body 28 upward to make the card pin 36 detached from the slot 20. In such a manner, as shown in FIG. 2, the user could easily pull the riser card 14 out of the motherboard module 10 and then perform the subsequent related operation (e.g. interface card expansion, replacement or maintenance).

It should be mentioned that disposal of the handle bar 34 is not limited to the aforesaid embodiment. For example, in another embodiment, the present invention could adopt the design that the handle bar 34 is aligned with the card pin 36 (i.e. the linkage device formed by the handle bar 34, the first linkage mechanism 30, and the second linkage mechanism 32 is substantially aligned with the card pin 36 of the main body 28), so that the user could exert a pressing force vertically on a portion of the man body 28 corresponding to the card pin 36 to ensure accurate and effortless operation for inserting the riser card 14 into the motherboard device 12. As for which design is utilized, it depends on the practical application of the motherboard module 10.

Compared with the prior art, the present invention adopts the leverage driving design that the linkage device formed by the handle bar, the first linkage mechanism and the second linkage mechanism abuts against the support pillars on the casing, to allow that the user could easily perform the assembly and disassembly operations of the riser card by simply pressing or pulling up the handle bar. In such a manner, the present invention could solve the prior art problem that inserting the riser card into the motherboard or detaching the riser card from the motherboard is time-consuming and strenuous, so as to greatly improve convenience of the motherboard module in assembly and disassembly of the riser card on the motherboard. Moreover, via the support design that the recessed end portion of the linkage is supported and positioned by the support pillar, the present invention could further solve the prior art problem the long body design of the riser card usually causes oblique angled installation and excessively large plugging force, so as to efficiently prevent damage of the card pin during the installation process of the riser card.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A riser card for inserting into a motherboard module, the motherboard module comprising a motherboard and a casing, the motherboard being disposed in the casing and having at least one slot, a side wall of the casing corresponding to the at least one slot having a first support pillar and a second support pillar, the riser card comprising:
   a main body having a card pin corresponding to the at least one slot;
   a first linkage mechanism comprising:
      a first linkage pivoted to the main body;
      a second linkage pivoted to the main body, the second linkage having a first recessed end portion; and
      a first bridge sheet having at least two first limiting pillars, the first bridge sheet being pivoted to the first linkage and the second linkage respectively, so as to make the first linkage and the second linkage swing in parallel to be oblique or parallel to the main body;
   a second linkage mechanism disposed at a side of the first linkage mechanism, the second linkage mechanism comprising:
      a third linkage pivoted to the main body;
      a fourth linkage pivoted to the main body, the fourth linkage having a second recessed end portion; and
      a second bridge sheet having at least two second limiting pillars, the second bridge sheet being pivoted to the third linkage and the fourth linkage respectively, so as to make the third linkage and the fourth linkage swing in parallel to be oblique or parallel to the main body; and
   a handle bar having a first sliding slot and a second sliding slot, the at least two first limiting pillars being slidably inserted into the first sliding slot and the at least two second limiting pillars being slidably inserted into the second sliding slot for making the handle bar movable between a non-pressed position and a pressed position with swinging of the first linkage mechanism and the second linkage mechanism;
   wherein when the first recessed end portion and the second recessed end portion are supported by the first support pillar and the second support pillar respectively and the handle bar is pressed from the non-pressed position to the pressed position, the at least two first limiting pillars slide inwardly along the first sliding slot and the at least two second limiting pillars slide inwardly along the second sliding slot to make the handle bar substantially collinear with the first linkage mechanism and the second linkage mechanism, and the first recessed end portion and the second recessed end portion abut against the first support pillar and the second support pillar respectively to move and rotate for generating lever torques to insert the card pin into the at least one slot.

2. The riser card of claim 1, wherein the side wall of the casing further has at least one positioning pillar, and the main body further has a positioning slot corresponding to the at least one positioning pillar, the positioning slot is engaged with the at least one positioning pillar to guide the card pin to be inserted into the at least one slot.

3. The riser card of claim 1, wherein the handle bar is disposed at a position substantially aligned with the card pin or corresponding to a longitudinal center axis of the main body.

4. The riser card of claim 1, wherein a distance between the first recessed end portion and a position where the second linkage is pivoted to the main body is less than a distance between the position where the second linkage is pivoted to the main body and a position where the second linkage is pivoted to the first bridge sheet.

5. The riser card of claim 1, wherein the first linkage mechanism is symmetrical with respect to the second linkage mechanism to make the handle bar located at the non-pressed position form an isosceles trapezoid shape cooperatively with the first linkage mechanism and the second linkage mechanism.

6. A motherboard module for being removably disposed in a server, the motherboard module comprising:
   a motherboard device comprising a motherboard and a casing, the motherboard being disposed in the casing and having at least one slot, a side wall of the casing corresponding to the at least one slot having a first support pillar and a second support pillar; and
   a riser card comprising:
      a main body having a card pin corresponding to the at least one slot;
      a first linkage mechanism comprising:
         a first linkage pivoted to the main body;
         a second linkage pivoted to the main body, the second linkage having a first recessed end portion; and
         a first bridge sheet having at least two first limiting pillars, the first bridge sheet being pivoted to the first linkage and the second linkage respectively, so as to make the first linkage and the second linkage swing in parallel to be oblique or parallel to the main body;
      a second linkage mechanism disposed at a side of the first linkage mechanism, the second linkage mechanism comprising:
         a third linkage pivoted to the main body;
         a fourth linkage pivoted to the main body, the fourth linkage having a second recessed end portion; and
         a second bridge sheet having at least two second limiting pillars, the second bridge sheet being pivoted to the third linkage and the fourth linkage respectively, so as to make the third linkage and the fourth linkage swing in parallel to be oblique or parallel to the main body; and
      a handle bar having a first sliding slot and a second sliding slot, the at least two first limiting pillars being slidably inserted into the first sliding slot and the at least two second limiting pillars being slidably inserted into the second sliding slot for making the handle bar movable between a non-pressed position and a pressed position with swinging of the first linkage mechanism and the second linkage mechanism;
      wherein when the first recessed end portion and the second recessed end portion are supported by the first support pillar and the second support pillar respectively and the handle bar is pressed from the non-pressed position to the pressed position, the at least two first limiting pillars slide inwardly along the first sliding slot and the at least two second limiting pillars slide inwardly along the second sliding slot to make the handle bar substantially collinear with the first linkage mechanism and the second linkage mechanism, and the first recessed end portion and the second recessed end portion abut against the first support pillar and the second support pillar respectively to move and rotate for generating lever torques to insert the card pin into the at least one slot.

7. The motherboard module of claim 6, wherein the side wall of the casing further has at least one positioning pillar, and the main body further has a positioning slot corresponding to the at least one positioning pillar, the positioning slot is engaged with the at least one positioning pillar to guide the card pin to be inserted into the at least slot.

8. The motherboard module of claim 6, wherein the handle bar is disposed at a position substantially aligned with the card pin or corresponding to a longitudinal center axis of the main body.

9. The motherboard module of claim 6, wherein a distance between the first recessed end portion and a position where the second linkage is pivoted to the main body is less than a distance between the position where the second linkage is pivoted to the main body and a position where the second linkage is pivoted to the first bridge sheet.

10. The motherboard module of claim 6, wherein the first linkage mechanism is symmetrical with respect to the second linkage mechanism to make the handle bar located at the non-pressed position form an isosceles trapezoid shape cooperatively with the first linkage mechanism and the second linkage mechanism.

* * * * *